United States Patent
Bianchi

(10) Patent No.: US 12,058,926 B2
(45) Date of Patent: Aug. 6, 2024

(54) POLYMERIC PHOTOVOLTAIC CELL WITH INVERTED STRUCTURE COMPRISING A CONJUGATED POLYMER COMPRISING AN ANTHRADITHIOPHENE DERIVATIVE

(71) Applicant: ENI S.P.A., Rome (IT)

(72) Inventor: Gabriele Bianchi, Novara (IT)

(73) Assignee: ENI S.p.A., Rome (IT)

( * ) Notice: Subject to any disclaimer, the term of this patent is extended or adjusted under 35 U.S.C. 154(b) by 105 days.

(21) Appl. No.: 17/776,109

(22) PCT Filed: Nov. 12, 2020

(86) PCT No.: PCT/IB2020/060658
§ 371 (c)(1),
(2) Date: May 11, 2022

(87) PCT Pub. No.: WO2021/094973
PCT Pub. Date: May 20, 2021

(65) Prior Publication Data
US 2022/0416169 A1    Dec. 29, 2022

(30) Foreign Application Priority Data

Nov. 12, 2019    (IT) .................. 102019000020964
Oct. 7, 2020    (IT) .................. 102020000023653

(51) Int. Cl.
     *H10K 85/10*      (2023.01)
     *C08G 61/12*      (2006.01)
     *H10K 30/30*      (2023.01)

(52) U.S. Cl.
     CPC ......... *H10K 85/113* (2023.02); *C08G 61/126* (2013.01); *H10K 85/111* (2023.02);
     (Continued)

(58) Field of Classification Search
CPC .... H10K 30/30; H10K 30/353; H10K 85/111; H10K 85/113; H10K 85/1135; H10K 85/151
See application file for complete search history.

(56) References Cited

U.S. PATENT DOCUMENTS 4,685,983 A    8/1987   Long, Jr.

FOREIGN PATENT DOCUMENTS

| TR | 201504603 A2 * | 6/2015 |
| WO | 2019137329 A1 | 7/2019 |
| WO | 2019175367 A1 | 9/2019 |

OTHER PUBLICATIONS

TR-201504603-A2 translation as provided by FIT database, translated on Nov. 4, 2023.*

(Continued)

*Primary Examiner* — Golam Mowla
(74) *Attorney, Agent, or Firm* — Ruggiero McAllister & McMahon LLC

(57) ABSTRACT

There is a polymeric photovoltaic cell (or solar cell) with inverted structure having an anode; an anodic buffer layer; an active layer having at least one photoactive organic polymer as electron-donor and at least one electron-accepting organic compound; a cathodic buffer layer; and a cathode. The at least one photoactive organic polymer is selected from conjugated polymers comprising an anthraditiophenic derivative having a general formula (I):

(I)

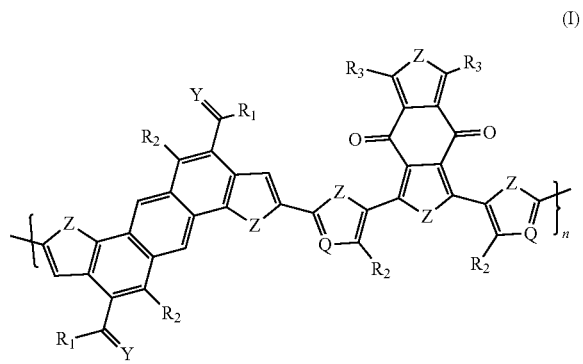

The polymeric photovoltaic cell (or solar cell) with inverted structure shows good values of power conversion efficiency (PCE) (η) and can be advantageously used in the construc- (Continued)

tion of photovoltaic modules (or solar modules), either on a rigid support or on a flexible support.

18 Claims, 3 Drawing Sheets

(52) U.S. Cl.
CPC ....... *H10K 85/1135* (2023.02); *H10K 85/151* (2023.02); *C08G 2261/124* (2013.01); *C08G 2261/1412* (2013.01); *C08G 2261/1426* (2013.01); *C08G 2261/149* (2013.01); *C08G 2261/18* (2013.01); *C08G 2261/3223* (2013.01); *C08G 2261/3243* (2013.01); *C08G 2261/91* (2013.01); *H10K 30/30* (2023.02)

(56) References Cited

OTHER PUBLICATIONS

International Search Report dated Jan. 13, 2021 for PCT Appl. No. PCT/IB2020/059769.
Written Opinion Report dated Jan. 13, 2021 for PCT Appl. No. PCT/IB2020/059769.
Zhang et al; "Nonfullerene Acceptor Molecules for Bulk Heterojunction Organic Solar Cells"; Chemica Reviews, vol. 118, No. 7; Mar. 20, 2018; pp. 3447-3507.
Biniek et al; "New Fused Bis-Thienobenzothienothiophene Copolymers and Their Use in Organic Solar Cells and Transistors"; Macromolecules, vol. 46, No. 3; Feb. 12, 2013; pp. 727-735.

\* cited by examiner

POLYMERIC PHOTOVOLTAIC CELL WITH INVERTED STRUCTURE COMPRISING A CONJUGATED POLYMER COMPRISING AN ANTHRADITHIOPHENE DERIVATIVE

CROSS-REFERENCE TO RELATED APPLICATIONS

This patent application claims priority from PCT Application No. PCT/IB2020/060658, filed Nov. 12, 2020, which claims priority from Italian Patent Application Nos. 102019000020964, filed on Nov. 12, 2019, and 102020000023653, filed on Oct. 7, 2020, the entire disclosures of which are incorporated herein by reference.

FIELD OF THE DISCLOSURE

The present disclosure relates to a polymeric photovoltaic cell (or solar cell) with inverted structure.

More particularly, the present disclosure relates to a polymeric photovoltaic cell (or solar cell) with inverted structure comprising (a) at least one conjugated polymer comprising an anthradithiophene derivative, said anthradithiophene derivative being disubstituted on the anthracene ring and a derivative of benzodithiophene-4,8-dione; (b) at least one organic electron-acceptor compound selected from non-fullerene, optionally polymeric, compounds.

DESCRIPTION OF THE RELATED ART

Photovoltaic devices (or solar devices) are devices capable of converting the energy of a light radiation into electricity. Currently, most photovoltaic devices (or solar devices) usable for practical applications, exploit the chemical-physical properties of photoactive materials of the inorganic type, in particular high purity crystalline silicon. Due to the high production costs of silicon, however, scientific research has long been directing its efforts towards the development of alternative organic-type materials having a conjugated, oligomeric or polymeric structure, in order to obtain organic photovoltaic devices (or solar devices) such as, for example, organic photovoltaic cells (or solar cells). In fact, unlike high purity crystalline silicon, said organic-type materials are characterized by a relative ease of synthesis, a low production cost, a reduced weight of the relative organic photovoltaic devices (or solar devices), as well as allowing said organic-type materials to be recycled at the end of the life cycle of the organic photovoltaic device (or solar device) in which they are used.

The above-mentioned advantages make the use of said organic-type materials energetically and economically attractive despite any lower efficiencies ($\square$) of the organic photovoltaic devices (or solar devices) thus obtained compared to inorganic photovoltaic devices (or solar devices).

The operation of the organic photovoltaic devices (or solar devices) such as, for example, organic photovoltaic cells (or solar cells), is based on the combined use of an electron-acceptor compound and an electron-donor compound. In the state of the art, the electron-acceptor compounds mostly used in organic photovoltaic devices (or solar devices) are fullerene derivatives, in particular the methyl ester of the [6,6]-phenyl-$C_{61}$-butyric acid (PC61BM) or the methyl ester of the (6,6)-phenyl-$C_{71}$-butyric acid (PC71BM), which have led to the greatest efficiencies when mixed with electron-donor compounds selected from $\square$-conjugated polymers such as, for example, polythiophenes ($\eta>5\%$), polycarbazoles ($\eta>6\%$), derivatives of poly(thienotiophene)-benzodithiophene (PTB) ($\eta>8\%$).

It is known that the elementary process of converting light into electric current in an organic photovoltaic cell (or solar cell) takes place through the following steps:

1. absorption of a photon by the electron-donor compound with the formation of an exciton, i.e. a pair of electron-electronic gap (or hole) charge carriers;
2. diffusion of the exciton in a region of the electron-donor compound up to the interface with the electron-acceptor compound;
3. dissociation of the exciton in the two charge carriers: electron (−) in the accepting phase (i.e. in the electron-acceptor compound) and electronic gap [(or hole) (+)] in the donor phase (i.e. in the electron-donor compound);
4. transport of the charges thus formed to the cathode (electron through the electron-acceptor compound) and to the anode [electronic gap (or hole) through the electron-donor compound], with generation of an electric current in the circuit of the organic photovoltaic cell (or solar cell).

The photoabsorption process with formation of the exciton and subsequent transfer of the electron to the electron-acceptor compound involves the excitation of an electron from the HOMO ("Highest Occupied Molecular Orbital") to the LUMO ("Lowest Unoccupied Molecular Orbital") of the electron-donor compound and, subsequently, the passage therefrom to the LUMO of the electron-acceptor compound.

Since the efficiency of an organic photovoltaic cell (or solar cell) depends on the number of free electrons that are generated by dissociation of excitons which is in turn directly correlated to the number of absorbed photons, one of the structural characteristics of the electron-donor compounds that mostly affects this efficiency is the difference in energy existing between the HOMO and LUMO orbitals of the electron-donor compound, that is the so-called band-gap. In particular, the maximum value of the wavelength at which the electron-donor compound is able to effectively harvest and convert photons into electricity, i.e. the so-called light harvesting or photon harvesting process, depends on this difference. In order to obtain acceptable electric currents, the band gap, that is the difference in energy between HOMO and LUMO of the donor compound, on the one hand must not be too high so as to allow the absorption of the largest number of photons and on the other hand it must not be too low because it could decrease the voltage to the electrodes of the device.

In the simplest way of operating, organic photovoltaic cells (or solar cells) are manufactured by introducing between two electrodes, usually consisting of indium-tin oxide (ITO) (anode) and aluminum (Al) (cathode), a thin layer (about 100 nanometers) of a mixture of the electron-acceptor compound and the electron-donor compound (an architecture known as bulk heterojunction). Generally, in order to make a layer of this type, a solution of the two compounds is prepared and, subsequently, a photoactive film is created on the anode [indium-tin oxide (ITO)] starting from said solution, using suitable deposition techniques such as, for example, spin-coating, spray-coating, ink-jet printing, and the like. Finally, the counter electrode [i.e. the aluminum cathode (Al)] is deposited on the dried film. Optionally, other additional layers (or buffer layers) can be introduced between the electrodes and the photoactive film, which layers are capable of performing specific functions of an electrical, optical, or mechanical nature.

Generally, in order to facilitate the achievement of the anode [indium-tin oxide (ITO)] by the electronic gaps (or holes) and at the same time to block the transport of electrons, thus improving the harvest of charges by the electrode and inhibiting the recombination phenomena, before creating the photoactive film starting from the mixture of the acceptor compound and the donor compound as described above, a film is deposited starting from an aqueous suspension of PEDOT:PSS [poly(3,4-ethylenedixythiophene)polystyrene sulfonate], using suitable deposition techniques such as, for example, spin-coating, spray-coating, ink-jet printing, and the like.

Polymeric photovoltaic cells (or solar cells) with inverted structure are also known. Generally, the polymeric photovoltaic cells (or solar cells) with inverted structure reported in the literature comprise the following layers: (i) a support of transparent material; (ii) an indium-tin oxide (ITO) cathode; (iii) a cathodic buffer layer which has the function of electron carrier and barrier to electronic gaps (or holes) generally comprising zinc oxide; (iv) a layer of photoactive material comprising an electron-donor compound and an electron-acceptor compound; (v) an anodic buffer layer which has the function of carrier of electronic gaps (or holes) and barrier to electrons comprising a hole-transporting material, generally selected from molybdenum oxide, tungsten oxide, vanadium oxide, (vi) generally, a silver (Ag), gold (Au) or aluminum (Al) anode.

The electron-donor compound most commonly used in the realization of organic photovoltaic cells (or solar cells) is the regioregular poly(3-hexylthiophene) (P3HT). This polymer has optimal electronic and optical characteristics (good values of the HOMO and LUMO orbitals, good molar absorption coefficient), good solubility in the solvents that are used to manufacture photovoltaic cells (or solar cells) and a moderate mobility of the electronic gaps.

Other examples of polymers that can be advantageously used as electron-donor compounds are: the PCDTBT polymer {poly[N-9"-heptadecanil-2,7-carbazole-alt-5,5-(4',7'-di-2-thienyl-2',1',3'-benzothiadiazole)]}, the PCPDTBT polymer {poly[2,6-(4,4-bis-(2-ethylhexyl)-4H-cyclopenta[2,1-b; 3,4-b']dithiophene)-alt-4,7(2,1,3-benzothiadiazole)]}.

Electron-donor compounds containing benzodithiophene units are also known which have a structure similar to poly(3-hexylthiophene) (P3HT) in which, however, the thiophene units are planarized by benzene rings. This feature, in addition to reducing the oxidation potential of said electron-donor compounds, improves their stability in the air and ensures their rapid packaging and, consequently, a high molecular order, during the realization of the photoactive film: this results in excellent transport properties of charges [electrons or electronic gaps (holes)]. Consequently, the use of electron-donor compounds containing benzodithiophene units can allow the realization of photovoltaic devices with better performances.

For example, electron-donor compounds containing benzodithiophene units are described by Huo L. and others in the article: "Synthesis of a polythieno[3,4-b]thiophene derivative with a low-lying HOMO level and its application in polymeric solar cells", "*Chemical Communication*" (2011), Vol. 47, p. 8850-8852, Said article describes the preparation of a polythieno[3,4-b]thiophene derivative by copolymerization between a planar benzodithiophene having a low HOMO value with a thieno[3,4-b]thiophene unit.

Benzodithiophene and/or the isomers thereof [e.g., benzo[1,2-b: 4,5-b']dithiophene or (BDT) and benzo[2,1-b: 3,4-b']dithiophene or (BDP)], are known to be compounds of significant interest whose synthesis has been the subject of numerous researches.

Generally, the electron-donor materials used in high efficiency photovoltaic cells are almost exclusively represented by polymers in which an electron-rich unit alternates with an electron-poor unit. Further details relating to said polymers can be found, for example, in the following articles: Yu L. and others, "How to design low bandgap polymers for highly efficient organic solar cells", "*Materials Today*" (2014), Vol. 17, No. 1, p. 11-15; You W. and others: "Structure-Property Optimizations in Donor Polymers via Electronics, Substituents, and Side Chains Toward High Efficiency Solar Cells", "*Macromolecular Rapid Communications*" (2012), Vol. 33, p. 1162-1177; Havinga E. E. and others: "A new class of small band gap organic polymer conductors", "*Polymer Bulletin*" (1992), Vol. 29, p. 119-126.

However, said electron-donor polymers are not always optimal. In fact, since the flow of photons of the solar radiation that reaches the surface of the earth is maximum for energy values around 1.8 eV (corresponding to radiations having a wavelength of about 700 nm), due to the high band-gap values (generally greater than 2 eV-3 eV) that characterize many of the aforementioned electron-donor polymers, the so-called light harvesting or photon harvesting process is not very efficient and only a part of the total solar radiation is converted into electricity.

In order to improve the yield of the so-called light harvesting or photon harvesting process and, consequently, the efficiency of organic photovoltaic devices (or solar devices), it is therefore essential to identify new electron-donor polymers capable of capturing and converting the wavelengths of solar radiation having lower energy, i.e. electron-donor polymers characterized by lower band-gap values than those of the polymers typically used as electron-donors.

To this end, efforts have been made in the art to identify electron-donor polymers having a low band gap value (i.e. a band gap value lower than 2 eV).

For example, one of the most commonly used strategies for obtaining electron-donor polymers having a low band-gap value is the synthesis of alternate conjugated polymers comprising electron-rich units (donor) and electron-poor units (acceptor). A summary of this type is described, for example by Chen J. and others in the article "Development of Novel Conjugated Donor Polymers for High-Efficiency Bulk-Heterojunction Photovoltaic Devices", "Account of Chemical Research" (2009), Vol. 42(11), page 1709-1718.

Anthradithiophene derivatives are also known which can be used both in the construction of photovoltaic devices (or solar devices), and in the construction of Organic Thin Film Transistors ('OTFT'), or of Organic Field Effect Transistor ('OFET'), or of Organic Light-Emitting Diodes ('OLEDs').

For example, Pietrangelo A. and others in the article "Conjugated Thiophene-Containing Oligoacenes Through Photocyclization: Bent Acenedithiophenes and a Thiahelicene", "*Journal of Organic Chemistry*" (2009), Vol. 74, p. 4918-4926 describe the preparation of anthraditiophene bents (BADTs) by oxidative photocycling of 2,5-dithienyl-1,4-distyrylbenzene. The aforesaid anthradithiophenes are said to be advantageously usable in the construction of Organic Thin Film Transistors ('OTFTs').

Quinton C. and others in the article "Evaluation of semiconducting molecular thin films solution-processed via the photoprecursor approach: the case of hexyl-substituted thienoanthracenes", "*Journal of Materials Chemistry C*" (2015), Vol. 3, p. 5995-6005, describe the use of thienoanthracenes disubstituted with hexyl groups on the thiophene ring as semi-conductors in the preparation of thin films by depositing a solution containing a photoprecursor selected from said disubstituted thienoanthracenes. Said disubstituted thienoanthracenes can be synthesized through various processes: for example, said disubstituted thienoanthracenes can be synthesized through a cyclization reaction catalysed by indium, or through a photochemical cyclization reaction of 2,5-bis(2-thienyl)-1,4-divinylbenzene.

Wu J. S. and others in the article "New Angular-Shaped and Isomerically Pure Anthradithiophene with Lateral Aliphatic Side Chains for Conjugated Polymers: Synthesis, Characterization, and Implications for Solution-Prossessed Organic Field-Effect Transistors and Photovoltaics", "*Chemistry of Materials*" (2012), Vol. 24, p. 2391-2399, describe alternated copolymers such as poly(anthradithiophene-alt-bithiophene) (PaADTDPP) and poly(anthradithiophene-alt-bithiophene) (PaADTDPP) rich in thiophene (PaADTT). Said alternated copolymers can be prepared by means of a double benzoannulation via Suzuki coupling starting from compounds of the benzene-thiophene dibromodiaryl type. The aforesaid alternated copolymers are said to be advantageously usable in the construction of photovoltaic cells (or solar cells) and of Organic Field Effect Transistors ('OFETs').

The processes described in the aforesaid documents relating to anthradithiophene derivatives, however, do not allow to obtain anthradithiophene derivatives directly functionalised on the anthracene ring.

Since both the organic photovoltaic devices (or solar devices), and the Organic Thin Film Transistors ('OTFTs'), or the Organic Field Effect Transistors ('OFETs'), or the Organic Light-Emitting Diodes ('OLEDs'), are currently of great interest, the study of new compounds and/or new electron-donor polymers with a low band gap (i.e. a band gap value lower than 2 eV), is of great interest, too.

For example, the international patent application WO 2019/175367 in the name of the Applicant, relates to an anthradithiophene derivative having general formula (I):

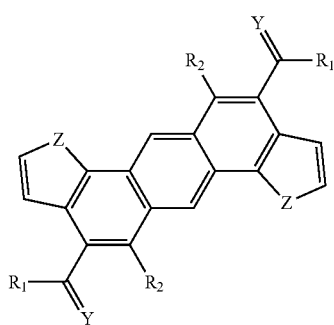

(I)

in which:
- Z, equal to or different from each other, preferably equal to each other, represent a sulphur atom, an oxygen atom, a selenium atom;
- Y, equal to or different from each other, preferably equal to each other, represent a sulphur atom, an oxygen atom, a selenium atom;
- $R_1$, equal to or different from each other, preferably equal to each other, are selected from amino groups —N—$R_3R_4$ in which $R_3$ represents a hydrogen atom, or is selected from alkyl groups $C_1$-$C_{20}$, preferably $C_2$-$C_{10}$, linear or branched, or is selected from optionally substituted cycloalkyl groups and $R_4$ is selected from alkyl groups $C_1$-$C_{20}$, preferably $C_2$-$C_{10}$, linear or branched, or is selected from optionally substituted cycloalkyl groups; or are selected from $C_1$-$C_{30}$ alkoxy groups, preferably $C_2$-$C_{20}$, linear or branched; or are selected from $R_5$—O—[$CH_2$—$CH_2$—O]$_n$— polyethyleneoxyl groups, in which $R_5$ is selected from $C_1$-$C_{20}$ alkyl groups, preferably $C_2$-$C_{10}$, linear or branched, and n is an integer between 1 and 4; or are selected from groups —$R_6$—$OR_7$ in which $R_6$ is selected from alkylenic groups $C_1$-$C_{20}$, preferably $C_2$-$C_{10}$, linear or branched and $R_7$ represents a hydrogen atom, or is selected from alkyl groups $C_1$-$C_{20}$, preferably $C_2$-$C_{10}$, linear or branched, or is selected from polyethylene oxides groups $R_5$—[—$OCH_2$—$CH_2$—]$_n$— in which $R_5$ has the same meanings as above and n is an integer between 1 and 4; or are selected from thiol groups —S—$R_8$ in which $R_8$ is selected from alkyl groups $C_1$-$C_{20}$, preferably $C_2$-$C_{10}$, linear or branched;
- $R_2$, equal to or different from each other, preferably equal to each other, represent a hydrogen atom; or are selected from $C_1$-$C_{20}$ alkyl groups, preferably $C_2$-$C_{10}$, linear or branched; or are selected from —$COR_9$ groups in which $R_9$ is selected from $C_1$-$C_{20}$ alkyl groups, preferably $C_2$-$C_{10}$, linear or branched; or are selected from —$COOR_{10}$ groups in which $R_{10}$ is selected from $C_1$-$C_{20}$ alkyl groups, preferably $C_2$-$C_{10}$, linear or branched; or are selected from optionally substituted aryl groups; or are selected from optionally substituted heteroaryl groups.

The aforesaid anthradithiophene derivative is said to be advantageously used in the synthesis of electron-donor polymers, said polymers being a further subject of said international patent application. The aforesaid polymers are said to be advantageously used in the construction of photovoltaic devices (or solar devices) such as, for example, photovoltaic cells (or solar cells), photovoltaic modules (or solar modules), either on a rigid support or on a flexible support. Furthermore, the aforesaid polymers are said to be advantageously used in the construction of Organic Thin Film Transistors ('OTFTs'), or Organic Field Effect Transistors ('OFETs'), or Organic Light-Emitting Diodes ('OLEDs').

SUMMARY OF THE DISCLOSURE

The Applicant has now found that some of the polymers comprising an anthradithiophene derivative described in the aforesaid international patent application WO 2019/175367, in particular conjugated polymers comprising an anthradithiophene derivative, said anthradithiophene derivative being disubstituted on the anthracene ring and a derivative of benzodithiophene-4,8-dione having the specific general formula (I) reported below, in addition to having a low band gap value (i.e. a band gap value lower than 2 eV), when used in the presence of electron-acceptor organic compounds selected from non-fullerene, optionally polymeric, compounds are able to give polymeric photovoltaic cells (or solar cells) with inverted structure with higher performance, in particular in terms of power conversion efficiency (PCE) (ID compared to those in which electron-donor polymers known in the art are used. Said polymeric photovoltaic cells (or solar cells) with inverted structure can be advantageously used in the construction of photovoltaic modules (or solar modules), either on a rigid support or on a flexible support.

Therefore, the object of the present disclosure is a polymeric photovoltaic cell (or solar cell) with inverted structure comprising:
- an anode;
- an anodic buffer layer;
- an active layer comprising at least one photoactive organic polymer as electron-donor and at least one electron-acceptor organic compound;
- a cathodic buffer layer;
- a cathode;

in which:
said at least one photoactive organic polymer is selected from conjugated polymers comprising an anthraditiophene derivative having general formula (I):

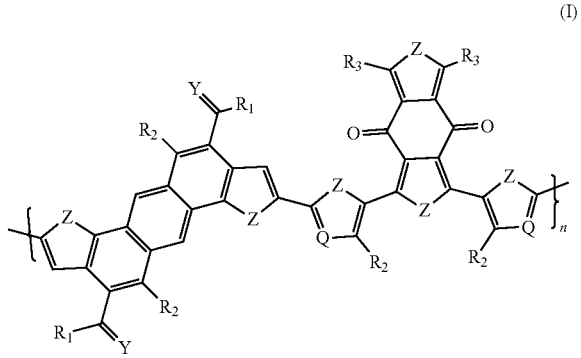

(I)

in which:
- Z, equal to or different from each other, preferably equal to each other, represent a sulphur atom, an oxygen atom, a selenium atom;
- Y, equal to or different from each other, preferably equal to each other, represent a sulphur atom, an oxygen atom;
- $R_1$, equal or different from each other, preferably equal to each other, are selected from amino groups $—N—R_4R_5$ in which $R_4$ represents a hydrogen atom, or is selected from alkyl groups $C_1$-$C_{20}$, preferably $C_2$-$C_{10}$, linear or branched, or is selected from optionally substituted cycloalkyl groups and $R_5$ is selected from alkyl groups $C_1$-$C_{20}$, preferably $C_2$-$C_{10}$, linear or branched, or is selected from optionally substituted cycloalkyl groups; or are selected from $R_6$—O—[$CH_2$—$CH_2$—O]$_n$— polyethylenoxyl groups in which $R_6$ represents a hydrogen atom, or is selected from alkyl groups $C_1$-$C_{20}$, preferably $C_2$-$C_{10}$, linear or branched, and n is an integer between 1 and 4; or are selected from —O—$R_7$ groups in which $R_7$ represents a hydrogen atom, or is selected from alkyl groups $C_1$-$C_{30}$, preferably $C_2$-$C_{24}$, linear or branched;
- $R_2$, equal to or different from each other, preferably equal to each other, represent a hydrogen atom; or are selected from $C_1$-$C_{20}$, alkyl groups, preferably $C_2$-$C_{10}$, linear or branched; or are selected from —$COR_{10}$ groups in which $R_{10}$ is selected from $C_1$-$C_{20}$ alkyl groups, preferably $C_2$-$C_{10}$, linear or branched; or are selected from —$COOR_{11}$ groups in which $R_{11}$ is selected from $C_1$-$C_{20}$ alkyl groups, preferably $C_2$-$C_{10}$, linear or branched; or are selected from optionally substituted aryl groups; or are selected from optionally substituted heteroaryl groups;
- $R_3$, equal to or different from each other, preferably equal to each other, represent a hydrogen atom; or are selected from $C_1$-$C_{20}$, alkyl groups, preferably $C_2$-$C_{10}$, linear or branched; or are selected from —$COR_{10}$ groups in which $R_{10}$ is selected from $C_1$-$C_{20}$ alkyl groups, preferably $C_2$-$C_{10}$, linear or branched; or are selected from —$COOR_{11}$ groups in which $R_{11}$ is selected from $C_1$-$C_{20}$ alkyl groups, preferably $C_2$-$C_{10}$, linear or branched; or are selected from optionally substituted aryl groups; or are selected from optionally substituted heteroaryl groups;
- Q, equal or different from each other, preferably equal to each other, represent a nitrogen atom; or represent a C—$R_3$ group in which $R_3$ has the same meanings as above;
- n is an integer between 10 and 500, preferably between 20 and 300;
- said at least one organic electron-acceptor compound can be selected from non-fullerene, optionally polymeric, compounds, such as, for example, compounds based on perylene-diimides or naphthalene-diimides and fused aromatic rings; indacenothiophenes with electron-poor terminal groups; compounds having an aromatic core capable of symmetrically rotating, for example, derivatives of corannulene or truxenone.

In accordance with a preferred embodiment of the present disclosure, in said general formula (I):
- Z, equal to each other, represent a sulphur atom;
- Y, equal to each other, represent an oxygen atom;
- $R_1$, equal to each other, represent a —O—$R_7$ group in which $R_7$ represents a $C_1$-$C_{30}$ alkyl group, preferably they are a 2-octyldodecyloxy group;
- $R_2$, equal to each other, represent a hydrogen atom;
- $R_3$, equal to each other, represent a $C_1$-$C_{20}$, alkyl group, preferably they are a 2-ethylhexyl group;
- Q, equal to each other, represent a $CR_3$ group in which $R_3$ represents a hydrogen atom.

Said polymeric photovoltaic cell (or solar cell) with inverted structure shows good values of power conversion efficiency (PCE) (η) and can be advantageously used in the construction of photovoltaic modules (or solar modules), either on a rigid support or on a flexible support.

DETAILED DESCRIPTION OF THE DISCLOSURE

Figure 1:
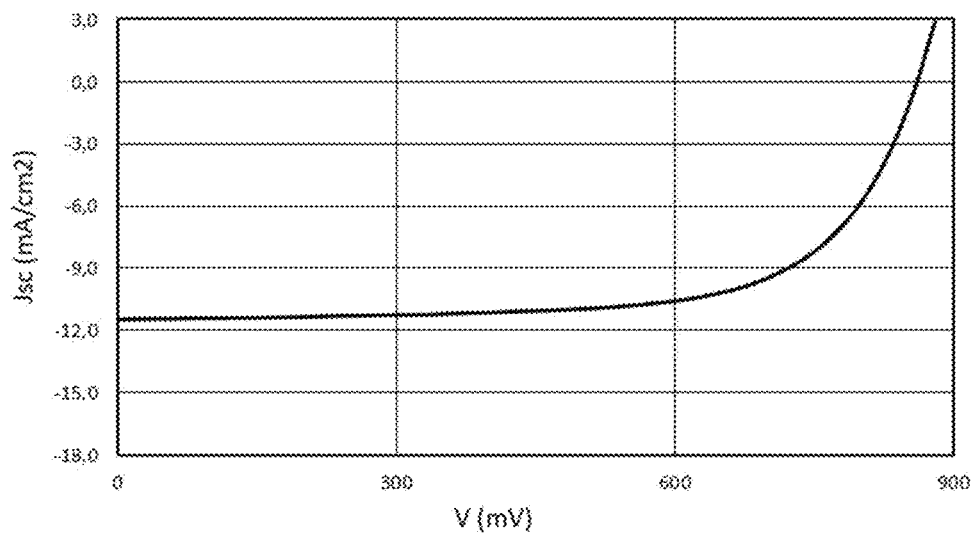
FIG. 1 shows a current-voltage curve (I-V) obtained in Example 6 (comparative).

For the purpose of the present description and the following claims, the definitions of the numerical intervals always comprise the extreme values unless otherwise specified.

For the purpose of the present description and the following claims, the term "comprising" also includes the terms "which essentially consists of" or "which consists of".

For the purpose of the present description and the following claims, the term "$C_1$-$C_{30}$ alkyl groups" and "$C_1$-$C_{20}$ alkyl groups" means alkyl groups containing from 1 to 30 carbon atoms and from 1 to 20 carbon atoms, respectively, linear or branched, saturated or unsaturated. Specific examples of $C_1$-$C_{20}$ alkyl groups are: methyl, ethyl, n-propyl, iso-propyl, n-butyl, iso-butyl, tert-butyl, pentyl, 2-ethylhexyl, hexyl, heptyl, n-octyl, nonyl, decyl, dodecyl, 2-octyldodecyl, 2-decyletethradecyl, 2-butyloctyl, 2-hexyldecyl, 3-decylpentadecyl, 4-decylhexadecyl, 3,7-dimethyloctyl.

For the purpose of the present description and the following claims, the term "cycloalkyl groups" means cycloalkyl groups containing from 3 to 30 carbon atoms. Said cycloalkyl groups can optionally be substituted with one or more groups, equal to or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxy groups; $C_1$-$C_{12}$ thioalkoxy groups; $C_3$-$C_{24}$ tri-alkylsilyl groups; polyethylenoxyl groups; cyano groups; amino groups; $C_1$-$C_{12}$ mono- or di-alkylamine groups; nitro groups. Specific examples of cycloalkyl groups are: cyclopropyl, 2,2-difluorocyclopropyl, cyclobutyl, cyclopentyl, cyclohexyl, methylcyclohexyl, methoxycyclohexyl, fluorocyclohexyl, phenylcyclohexyl, decalin, abietyl.

For the purpose of the present description and the following claims, the term "aryl groups" means aromatic carbocyclic groups containing from 6 to 60 carbon atoms. Said aryl groups can optionally be substituted with one or more groups, equal to or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxy groups; $C_1$-$C_{12}$ thioalkoxy groups; $C_3$-$C_{24}$ tri-alkylsilyl groups; polyethylenoxyl groups; cyano groups; amino groups; $C_1$-$C_{12}$ mono- or di-alkylamine groups; nitro groups. Specific examples of aryl groups are: phenyl, methylphenyl, trimethylphenyl, methoxyphenyl, hydroxyphenyl, phenyloxyphenyl, fluorophenyl, pentafluorophenyl, chlorophenyl, bromophenyl, nitrophenyl, dimethylaminophenyl, naphthyl, phenylnaphthyl, phenanthrene, anthracene.

For the purpose of the present description and the following claims, the term "heteroaryl groups" means heterocyclic aromatic, penta- or hexa-atomic groups, also benzo-condensed or heterobicyclic, containing from 4 to 60 carbon atoms and from 1 to 4 heteroatoms selected from nitrogen, oxygen, sulfur, silicon, selenium, phosphorus. Said heteroaryl group can optionally be substituted with one or more groups, equal to or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxy groups; $C_1$-$C_{12}$ thioalkoxy groups; $C_3$-$C_{24}$ tri-alkylsilyl groups; polyethylenoxyl groups; cyano groups; amino groups; $C_1$-$C_{12}$ mono- or di-alkylamine groups; nitro groups. Specific examples of heteroaryl groups are: pyridine, methylpyridine, methoxypyridine, phenylpyridine, fluoropyridine, pyrimidine, pyridazine, pyrazine, triazine, tetrazine, quinoline, quinoxaline, quinazoline, furan, thiophene, hexylthiophene, bromothiophene, dibromothiophene, pyrrole, oxazole, thiazole, isothiazole, oxadiazole, thiadiazole, pyrazole, imidazole, triazole, tetrazole, indole, benzofuran, benzothiophene, benzooxazole, benzothiazole, benzooxadiazole, benzothiadiazole, benzopyrazole, benzimidazole, benzotriazole, triazolopyridine, coumarin.

The term "polyethylenoxyl groups" means a group containing oxyethylene units in the molecule. Specific examples of polyethylenoxyl group are: methyloxy-ethylenoxyl, methyloxy-diethyleneoxyl, 3-oxatetraoxyl, 3,6-dioxaheptyloxyl, 3,6,9-trioxadecyloxyl, 3,6,9,12-tetraxohexadecyloxyl.

The conjugated polymer containing an anthradithiophene derivative having general formula (I) can be prepared according to techniques known in the art as described, for example, in the aforesaid international patent application WO 2019/175367 in the name of the Applicant, incorporated herein by reference. Further details relating to the processes for the preparation of said conjugated polymer containing an anthradithiophene derivative having general formula (I) can be found in the following examples.

In accordance with a preferred embodiment of the present disclosure, said organic electron-acceptor compound can be selected from 3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indacene[1,2-b: 5,6-b']-dithiophene, poly{[N,N'-bis(2-octyldodecyl)-1,4,5,8-naphthalene-diimide-2,6-diyl]-alt-5,5'-(2,2'-bithiophene)}, or mixtures thereof.

More details relating to said non-fullerene compounds can be found, for example, in Nielsen C. B. and others, "*Accounts of Chemical Research*" (2015), Vol. 48, pages 2803-2812; Zhan C. and others, "*RSC Advances*" (2015), Vol. 5, pages 93002-93026.

In accordance with a preferred embodiment of the present disclosure, said anode can be made of metal, said metal being preferably selected, for example, from silver (Ag), gold (Au), aluminum (Al); or it can consist of grids in conductive material, said conductive material being preferably selected, for example, from silver (Ag), copper (Cu), graphite, graphene, and of a transparent conductive polymer, said transparent conductive polymer being preferably selected, for example, from PEDOT:PSS[poly(3,4-ethylenedioxythiophene):poly(styrene sulfonate)], polyaniline (PANI); or it can consist of an ink based on metal nanowires, said metal being preferably selected, for example, from silver (Ag), copper (Cu).

Said anode can be obtained by depositing said metal on top of said anodic buffer layer through the deposition techniques known in the art such as, for example, vacuum evaporation, flexographic printing, knife-over-edge-coating, spray-coating, screen-printing. Alternatively, said anode can be obtained through deposition, above said anodic buffer layer, of said transparent conductive polymer via spin coating, or gravure printing, or flexographic printing, or slot die coating, followed by deposition of said grids in conductive material via evaporation, or screen-printing, or spray-coating, or flexographic printing. Alternatively, said anode can be obtained through deposition, above said anodic buffer layer of said ink based on metal nanowires via spin coating, or gravure printing, or flexographic printing, or slot die coating.

In accordance with a preferred embodiment of the present disclosure, said anodic buffer layer can be selected, for example, from PEDOT:PSS [poly(3,4-ethylenedioxythiophene):polystyrene sulfonate], polyaniline (PANI), preferably PEDOT:PSS [poly(3,4-ethylenedioxythiophene):polystyrene sulfonate].

Dispersions or solutions of PEDOT:PSS [poly(3,4-ethylenedioxythiophene):polystyrene sulfonate] which can be advantageously used for the purpose of the present disclosure and which are currently commercially available are the products Clevios™ by Heraeus, Orgacon™ by Agfa.

In order to improve the deposition and the properties of said anodic buffer layer, one or more additives can be added to said dispersions or solutions, such as, for example: polar solvents such as, for example, alcohols (for example, methanol, ethanol, propanol), dimethyl sulfoxide, or mixtures thereof; anionic surfactants such as, for example, carboxylates, sulfonated α-olefins, sulfonated alkyl-benzenes, alkyl sulfonates, esters of alkyl-ether sulfonates, triethanolamines alkyl sulfonates, or mixtures thereof; cationic surfactants such as, for example, alkyltrimethylammonium salts, dialkyldimethylammonium chlorides, alkylpyridinium chlorides, or mixtures thereof; ampholytic surfactants such as, for example, alkylcarboxybetaines, or mixtures thereof; non-ionic surfactants such as, for example, carboxylic diethanolamides, polyoxyethylene alkyl ethers, polyoxyethylene alkyl phenyl ethers, or mixtures thereof; polar compounds (for example, imidazole), or mixtures thereof; or mixtures thereof. More details relating to the addition of said additives can be found, for example, in: Synooka O. and others, "*ACS Applied Materials & Interfaces*" (2014), Vol. 6(14), pages 11068-11081; Fang G. and others, "*Macromolecular Chemistry and Physics*" (2011), Vol. 12, Issue 17, pages 1846-1851.

Said anodic buffer layer can be obtained by depositing the PEDOT:PSS [poly(3,4-ethylenedioxythiophene):polystyrene sulfonate], or the polyaniline (PANI), in the form of dispersion or solution, above the anode through the deposition techniques known in the art such as, for example, vacuum evaporation, spin coating, drop casting, doctor blade casting, spin-coating, slot die coating, gravure printing, flexographic printing, knife-over-edge-coating, spray-coating, screen-printing.

Said active layer can be obtained by depositing, above said cathodic buffer layer, a solution comprising at least one photoactive organic polymer selected from the conjugated polymers comprising an anthraditiophene derivative having general formula (I) above reported and at least one electron-acceptor organic compound selected from the non-fullerene, optionally polymeric, compounds, above reported, using appropriate deposition techniques such as, for example, spin-coating, spray-coating, ink-jet printing, slot die coating, gravure printing, screen printing.

In accordance with a preferred embodiment of the present disclosure, said cathodic buffer layer can comprise zinc oxide, titanium oxide, preferably zinc oxide.

Said cathodic buffer layer can be obtained by depositing a precursor solution of zinc oxide on said cathode through deposition techniques known in the art such as, for example, vacuum evaporation, spin-coating, drop casting, doctor blade casting, slot die coating, gravure printing, flexographic printing, knife-over-edge-coating, spray-coating, screen-printing.

More details in relation to the formation of said cathodic buffer layer starting from a precursor solution of zinc oxide can be found, for example, in Pò R. and others, "*Energy & Environmental Science*" (2014), Vol. 7, pages 925-943.

In accordance with a preferred embodiment of the present disclosure, said cathode can be of a material selected, for example, from: indium tin oxide (ITO), fluorine-doped tin oxide (FTO), aluminum-doped zinc oxide (AZO), gadolinium oxide-doped zinc oxide (GZO); or it can consist of grids in conductive material, said conductive material being preferably selected, for example, from silver (Ag), copper (Cu), graphite, graphene, and of a transparent conductive polymer, said transparent conductive polymer being preferably selected, for example, from PEDOT:PSS [poly (3,4-ethylenedioxythiophene):poly(styrene sulfonate)], polyaniline (PANI); or it can consist of an ink based on metal nanowires, said metal being preferably selected, for example, from silver (Ag), copper (Cu).

Said cathode can be obtained through techniques known in the art such as, for example, sputtering, deposition assisted by electron beam. Alternatively, said cathode can be obtained through deposition of said transparent conductive polymer via spin coating, or gravure printing, or flexographic printing, or slot die coating, preceded by deposition of said grids in conductive material via evaporation, or screen-printing, or spray-coating, or flexographic printing. Alternatively, said cathode can be obtained through deposition of said ink based on metal nanowires via spin coating, or gravure printing, or flexographic printing, or slot die coating. The deposition can take place on the support layer selected from those listed below.

In accordance with a preferred embodiment of the present disclosure, said cathode can be associated with a support layer which can be made of transparent rigid material such as, for example, glass, or of flexible material such as, for example, polyethylene terephthalate (PET), polyethylene naphthalate (PEN), polyethylene imine (PI), polycarbonate (PC), polypropylene (PP), polyimide (PI), triacetyl cellulose (TAC), or copolymers thereof.

As mentioned above, the anode, the cathode, the anodic buffer layer, and the cathodic buffer layer present in the aforesaid polymeric photovoltaic cell (or solar cell) with inverted structure, can be deposited by techniques known in the art. More details related to these techniques can be found, for example in: Pò R. and others, "*Interfacial Layers*", in "*Organic Solar Cells—Fundamentals, Devices, and Upscaling*" (2014), Chapter 4, Richter H. and Rand B. Eds., Pan Stanford Publishing Pte Ltd.; Yoo S. and others, "*Electrodes in Organic Photovoltaic Cells*", in "*Organic Solar Cells—Fundamentals, Devices, and Upscaling*" (2014), Chapter 5, Richter H. and Rand B. Eds., Pan Stanford Publishing Pte Ltd.; Angmo D. and others, "*Journal of Applied Polymer Science*" (2013), Vol. 129, Issue 1, pages 1-14.

As said above, said polymeric photovoltaic cells (or solar cells) with inverted structure can be advantageously used in the construction of photovoltaic modules (or solar modules), either on a rigid support or on a flexible support.

A further object of the present disclosure is therefore a photovoltaic module (or solar module), either on a rigid support or on a flexible support, comprising at least one polymeric photovoltaic cell (or solar cell) with inverted structure described above.

Figure 4:
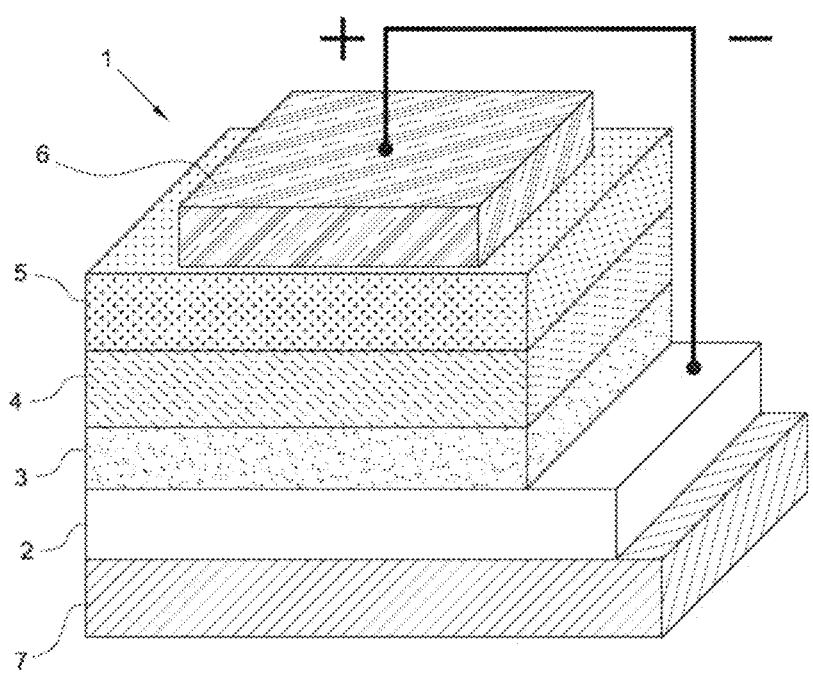
FIG. 4 below represents a cross-sectional view of a polymeric photovoltaic cell (or solar cell) with inverted structure of the present disclosure.

FIG. 4 below represents a cross-sectional view of a polymeric photovoltaic cell (or solar cell) with inverted structure object of the present disclosure.

With reference to FIG. 4, the polymeric photovoltaic cell (or solar cell) with inverted structure (1) comprises:
  a transparent glass support (7);
  a cathode (2) of indium-tin oxide (ITO);
  a cathodic buffer layer (3) comprising zinc oxide (ZnO);
  a layer of photoactive material (4) comprising regioregular poly(3-hexylthiophene) (P3HT) or a conjugated polymer comprising an anthraditiophene derivative having general formula (I) and 3,9-bis(2-methylene-((3-(1,1-dicyanomethylene)-6,7-difluoro)-indanone))-5,5,11,11-tetrakis(4-hexyl-phenyl)-dithieno[2,3-d:2',3'-d']-s-indacene[1,2-b: 5,6-b']-dithiophene (IT-4F);
  an anodic buffer layer (5) comprising molybdenum oxide ($MoO_3$);
  a silver (Ag) anode (6).

In order to better understand the present disclosure and to put it into practice, some illustrative and non-limiting examples thereof are reported below.

EXAMPLES

Characterization of the Polymers Obtained

Determination of the Molecular Weight

The molecular weight of the conjugated polymers obtained by operating in accordance with the following examples, was determined by Gel Permeation Chromatography ("GPC") on a WATERS 150C instrument, using HT5432 columns, with trichlorobenzene eluent, at 80° C.

The weight average molecular weight ($M_w$), the number average molecular weight ($M_n$) and the polydispersity index ("PDI"), corresponding to the $M_w/M_n$ ratio, are given.

Determination of the Optical Band-Gap

The conjugated polymers obtained by operating in accordance with the following examples, were characterized by UV-Vis-NIR spectroscopy to determine the energetic entity of the optical band-gap in solution or on thin film according to the following procedure.

In the case that the optical band-gap was measured in solution, the polymer was dissolved in toluene, chloroform, chlorobenzene, dichlorobenzene, trichlorobenzene, or other suitable solvent. The solution thus obtained was placed in a quartz cuvette and analysed in transmission by means of a double-beam UV-Vis-NIR spectrophotometer and double monochromator Perkin Elmer λ 950, in the range 200 nm-850 nm, with a 2.0 nm bandwidth, scanning speed of 220 nm/min and 1 nm step, using as a reference an identical quartz cuvette containing only the solvent used as a reference.

In the case that the optical band-gap was measured on thin film, the polymer was dissolved in toluene, chloroform, chlorobenzene, dichlorobenzene, trichlorobenzene, or other suitable solvent, obtaining a solution having a concentration equal to about 10 mg/ml, which was deposited by spin-coating on a Suprasil quartz slide. The thin film thus obtained was analysed in transmission by means of a dual-beam UV-Vis-NIR spectrophotometer and double monochromator Perkin Elmer λ 950, in the range 200 nm-850 nm, with a 2.0 nm bandwidth, scanning speed of 220 nm/min and 1 nm step, using an identical Suprasil quartz slide as such, as a reference.

The optical band-gap was estimated from the spectra in transmission by measuring the absorption edge corresponding to the transition from the valence band (VB) to the conduction band (CB). The intersection with the abscissa axis of the straight line tangent to the absorption band at the inflection point was used for the determination of the edge.

The inflection point ($\lambda_F$, $y_F$) was determined on the basis of the coordinates of the minimum of the spectrum in the first derivative, indicated with $\lambda'_{min}$ and $y'_{min}$.

The equation of the straight line tangent to the UV-Vis spectrum at the inflection point ($\lambda_F$, $y_F$) is as follows:

$$y = y'_{min}\lambda + y_F - y'_{min}\lambda'_{min}$$

Finally, from the condition of intersection with the abscissa axis φ=0, it was obtained:

$$\lambda_{EDGE} = (y'_{min}\lambda'_{min} - y_F)/y'_{min}$$

Therefore, by measuring the coordinates of the minimum of the first derivative spectrum and the corresponding absorbance value $y_F$ from the UV-Vis spectrum, $\lambda_{EDGE}$ was obtained directly by substitution.

The corresponding energy is:

$$E_{EDGE} = h\nu_{EDGE} = hc/\lambda_{EDGE}$$

wherein:
 h=6.626 10-34 J s;
 c=2.998 108 m s$^{-1}$;
that is:

$$E_{EDGE} = 1.988\ 10\text{-}16\ \text{J}/\lambda_{EDGE}\ \text{(nm)}.$$

Lastly, remembering that 1 J=6.24 1018 eV, we have:

$$E_{EDGE} = 1240\ \text{eV}/\lambda_{\varphi EDGE}\ \text{(nm)}.$$

Determination of HOMO and LUMO

The determination of the HOMO and LUMO values of the conjugated polymers obtained by operating in accordance with the following examples, was carried out using the cyclic voltammetry (CV) technique. This technique makes it possible to measure the values of the potentials of formation of the radical cation and radical anion of the sample under examination. These values, inserted in a special equation, allow the HOMO and LUMO values of the polymer in question to be obtained. The difference between HOMO and LUMO makes the value of the electrochemical band-gap.

The values of the electrochemical band-gap are generally higher than the values of the optical band-gap since during the execution of the cyclic voltammetry (CV), the neutral compound is charged and undergoes a conformational reorganization, with an increase in the energy gap, while optical measurement does not lead to the formation of charged species.

The cyclic voltammetry (CV) measurements were performed with an Autolab PGSTAT12 potentiostat (with GPES Ecochemie software) in a three-electrode cell. In the measurements carried out, an Ag/AgCl electrode was used as the reference electrode, a platinum wire as the counter electrode and a glassy graphite electrode as the working electrode. The sample to be analysed was dissolved in a suitable solvent and subsequently deposited, with a calibrated capillary, on the working electrode, so as to form a film. The electrodes were immersed in a 0.1 M electrolytic solution of 95% tetrabutylammonium tetrafluroborate in acetonitrile. The sample was subsequently subjected to a cyclic potential in the shape of a triangular wave. At the same time, as a function of the applied potential difference, the current, which signals the occurrence of oxidation or reduction reactions of the present species, was monitored.

The oxidation process corresponds to the removal of an electron from HOMO, while the reduction cycle corresponds to the introduction of an electron into LUMO. The potentials of formation of radical cation and radical anion were derived from the value of the peak onset ($E_{onset}$), which is caused by molecules and/or chain segments with HOMO-LUMO levels closer to the edges of the bands. The electrochemical potentials to those related to the electronic levels can be correlated if both refer to the vacuum. For this purpose, the potential of ferrocene in vacuum, known in the literature and equal to −4.8 eV, was taken as a reference. The inter-solvent redox pair ferrocene/ferrocinium (Fc/Fc$^+$) was selected because it has an oxide-reduction potential independent of the working solvent.

The general formula for calculating the energies of the HOMO-LUMO levels is therefore given by the following equation:

$$E\ (\text{eV}) = -4{,}8 + [E_{1/2\ Ag/AgCl}(Fc/Fc^+) - E_{onset\ Ag/AgCl}\ (\text{polymer})]$$

wherein:

E=HOMO or LUMO according to the entered $E_{onset}$ value;

$E_{1/2\ Ag/AgCl}$=half-wave potential of the peak corresponding to the redox pair ferrocene/ferrocinium measured under the same analysis conditions as the sample and with the same trio of electrodes used for the sample;

$E_{onset\ Ag/AgCl}$=onset potential measured for the polymer in the anodic area when calculating HOMO and in the cathodic area when calculating LUMO.

Example 1

Preparation of 2,5-dibromobenzene-1,4-dicarbaldehyde Having Formula (II)

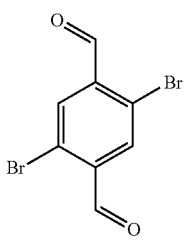

(II)

In a 100 ml flask, equipped with magnetic stirring, thermometer and coolant, in an inert atmosphere, N-bromosuccinaldehyde (Aldrich) (11.57 g; 65 mmoles) was added in small portions, over 15 minutes, to a solution of terephthaldehyde (Aldrich) (4.02 g; 30 mmoles) in sulfuric acid (Aldrich) (40 ml): the reaction mixture obtained was left, in an inert atmosphere, under stirring, at room temperature (25° C.), for 3 hours. Subsequently, the reaction mixture was placed in water and ice and the white precipitate obtained was recovered by filtration obtaining a solid. The solid was dissolved in dichloromethane (Aldrich) (200 ml) and the solution obtained was placed in a 500 ml separating funnel: the whole was extracted with a saturated sodium bicarbonate solution (Aldrich) (3×100 ml) obtaining an acid aqueous phase and an organic phase. The entire organic phase (obtained by combining the organic phases deriving from the three extractions) was washed to neutral with distilled water (3×50 ml) and subsequently anidrified on sodium sulphate (Aldrich) and evaporated obtaining a solid which was further purified by crystallization with ethyl acetate (Aldrich). The crystals obtained were collected by filtration obtaining 6.57 g of 2,5-dibromobenzene-1,4-dicarbaldehyde having formula (II) (yield 75%).

Example 2

Preparation of bis(2-octyldodecyl)[1,2-b: 5,6-b] dithiophene-4,10-dicarboxylate Having Formula (III)

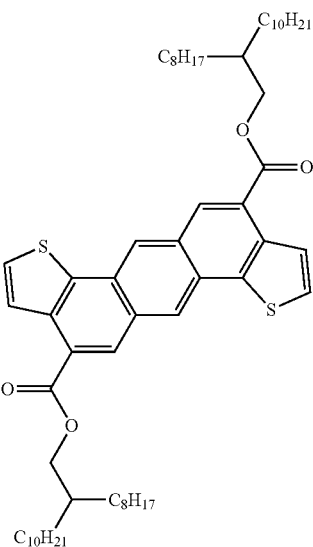

(III)

In a 100 ml flask, equipped with magnetic stirring, thermometer and coolant, in an inert atmosphere, 2,5 dibromobenzene-1,4-dicarbaldehyde having formula (II) obtained as described in Example 1 (0.292 g; 1.0 mmol) and potassium carbonate ($K_2CO_3$) (Aldrich) (0.691 g; 5.0 mmol) were added to a mixture of 3-thiopheneacetic acid (Aldrich) (0.312 g; 2.2 mmol), triphenylphosphine (Aldrich) (0.026 g; 0.1 mmol), palladium(II)acetate [Pd(OAc)$_2$] (0.112 g; 0.5 mmol) in anhydrous N,N-dimethylformamide (DMF) (Aldrich) (5 ml): the resulting reaction mixture was heated to 80° C. and left under stirring, at said temperature, for 24 hours. Subsequently, 1-bromo-2-octyldodecane (Sunatech) (0.795 g; 2.2 mmol) was added in a single portion: the reaction mixture obtained was left, under stirring, at 80° C., for 24 hours. Subsequently, after cooling to room temperature (25° C.), the reaction mixture was placed in a 500 ml separating funnel: an ammonium chloride (NH$_4$Cl) 0.1 (Aldrich) (3×100 ml) solution was added to said reaction mixture and the whole was extracted with ethyl acetate (Aldrich) (3×100 ml) obtaining an aqueous phase and an organic phase. The entire organic phase (obtained by combining the organic phases deriving from the three extractions) was separated and subsequently anidrified on sodium sulphate (Aldrich) and evaporated. The residue obtained was purified by elution on a chromatographic column of silica gel [(eluent: n-heptane/ethyl acetate 98/2) (Carlo Erba)], obtaining 0.752 g of bis(2-octyldodecyl)anthra[1,2-b: 5,6-b']dithiophene-4,10-dicarboxylate having formula (III) as a waxy yellow solid (yield 80%).

Example 3

Preparation of bis(2-octyldodecyl)-2,7-bis-(tributyl-stannyl)anthra[1,2-b: 5,6-b']dithiophene-4,10-dicarboxylate Having Formula (IV)

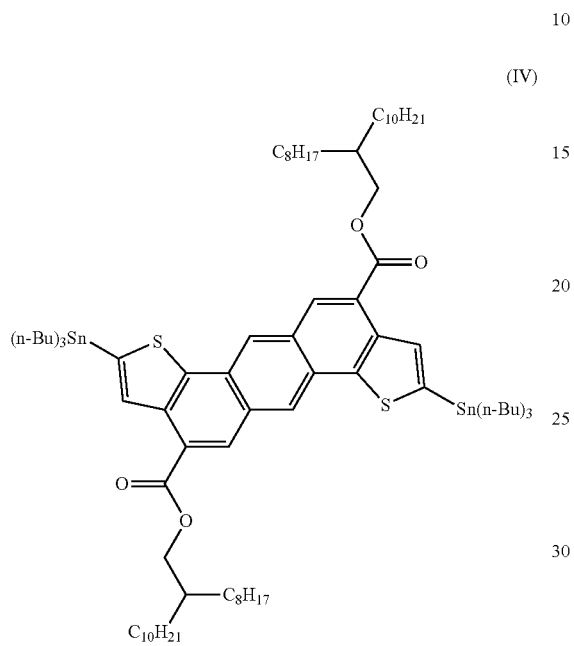

(IV)

In a 250 ml flask, equipped with magnetic stirring, the following were charged, under an argon flow, in the order: bis(2-octyldodecyl)anthra[1,2-b: 5,6-b']dithiophene-4,10-dicarboxylate having formula (III) (0.470 g; 0.5 mmoles) obtained as described in Example 2, and 40 ml of anhydrous tetrahydrofuran (THF) (Aldrich). The reaction mixture obtained was placed at −78° C. for about 10 minutes. Subsequently, 4.4 ml of a lithium di-iso-propylamine (LDA) solution was added by dripping in a mixture of tetrahydrofuran (THF)/hexane (1:1, v/v) 2.0 M (0.182 g; 1.7 mmoles) (Aldrich): the reaction mixture obtained was kept at −78° C. for 3 hours. Subsequently, 0.678 ml of tri-butyl tin chloride (1.302 g; 4 mmoles) were added by dripping: the reaction mixture obtained was placed at −78° C., for 30 minutes and, subsequently, at room temperature (25° C.), for 16 hours. Subsequently, the reaction mixture was placed in a 500 ml separating funnel: said reaction mixture was diluted with a 0.1 M sodium bicarbonate solution (Aldrich) (200 ml) and extracted with diethyl ether (Aldrich) (3×100 ml), obtaining an acid aqueous phase and an organic phase. The entire organic phase (obtained by combining the organic phases deriving from the three extractions) was washed to neutral with water (3×50 ml) and subsequently anidrified on sodium sulphate (Aldrich) and evaporated. The residue obtained was purified by elution on a basic alumina chromatographic column (Aldrich) [(eluent: n-heptane) (Aldrich)], obtaining 0.607 g of bis(2-octyldodecyl)-2,7-bis(tributylstannyl)-anthra[1,2-b: 5,6-b']dithiophene-4,10-dicarboxylate having formula (IV) as straw yellow oil (yield 80%).

Example 4

Preparation of the Conjugated Copolymer Containing an Anthradithiophene Derivative Having Formula (Ia)

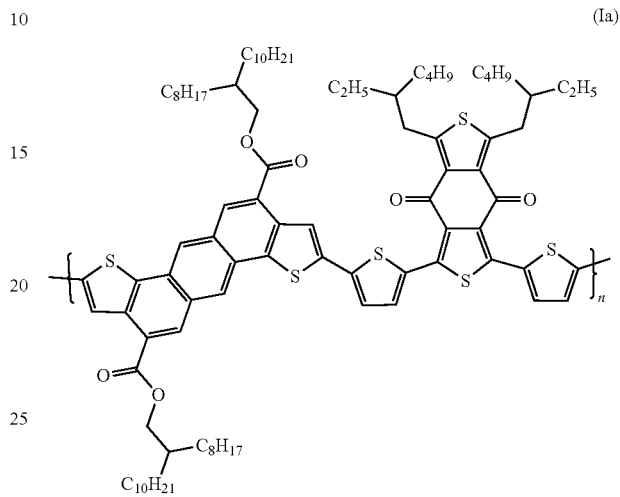

(Ia)

In a 250 ml flask, equipped with magnetic stirring, thermometer and coolant, in an inert atmosphere, the following were charged in the order: bis(2-octyl-dodecyl)-2,7-bis(tributylstannil)anthra[1,2-b: 5,6-b']dithiophene-4,10-dicarboxylate having formula (IV) obtained as described in Example 3 (1.517 g; 1.05 mmoles), chlorobenzene (Aldrich) (100 ml), 1,3-bis(5-bromothiophene-2-yl)-5,7-(bis(2-ethylhexyl)benzo-[1,2-c:4,5-c']dithiophene-4,8-dione (Sunantech) (0.767 g; 1.00 mmoles), tris(dibenzylideneacetone) dipalladium(0) [$Pd_2(dba)_3$] (Aldrich) (0.018 g; 0.02 mmoles) and tris(ortho-tolyl)phosphine [$P(o-tol)_3$] (Aldrich) (0.024 g; 0.08 mmoles). Subsequently, the reaction mixture was heated under reflux and left under stirring for 18 hours. The colour of the reaction mixture turned violet after 3 hours and turned dark violet at the end of the reaction (i.e. after 18 hours). Subsequently, after cooling to room temperature (25° C.), the reaction mixture obtained was placed in methanol (Aldrich) (300 ml) and the precipitate obtained was subjected to sequential extraction in a Soxhlet apparatus with methanol (Aldrich), acetone (Aldrich), n-heptane (Aldrich) and, finally, chloroform (Aldrich). The residue left inside the Soxhlet apparatus was dissolved in dichlorobenzene (Aldrich) (50 ml) at 80° C. and, subsequently, the hot solution obtained was precipitated in methanol (300 ml) (Aldrich). The obtained precipitate was collected and dried under vacuum at 50° C. for 16 hours, obtaining 1.23 g of a dark violet solid product (80% yield), corresponding to the conjugated polymer comprising an anthradithiophene derivative having formula (Ia).

Said solid product was subjected to determination of the molecular weight by Gel Permeation Chromatography ("GPC") operating as described above, obtaining the following data:

($M_w$)=74141 Dalton;

(PDI)=6.369.

The values of the optical band-gap, operating as described above, both in solution ($E_g^{opt}{}_{solution}$), and on thin film ($E_g^{opt}{}_{film}$) and the HOMO value were also determined:

$(\lambda_{EDGE}$ sol$)=650$ nm;
$(\lambda_{EDGE}$ film$)=654$ nm;
$E_g^{opt}{}_{film}=1.90$ eV;
$E_g^{opt}{}_{solution}=1.91$ eV;
HOMO$=-5.49$ eV.

Example 5 (Comparative)

Solar Cell Comprising Regioregular Poly-3-Hexylthiophene (P3HT)

For this purpose, a polymeric solar cell with inverted structure was used, schematically represented in FIG. 4.

For this purpose, a polymer-based device was prepared on an ITO (indium-tin oxide) coated glass substrate (Kintec Company—Hong Kong), previously subjected to a cleaning procedure consisting of a manual cleaning, rubbing with a lint-free cloth soaked in a detergent diluted with tap water. The substrate was then rinsed with tap water. Subsequently, the substrate was thoroughly cleaned using the following methods in sequence: ultrasonic baths in (i) distilled water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was placed in a beaker containing the solvent, placed in an ultrasonic bath, left at 40° C., for a treatment of 10 minutes. After treatments (iii) and (iv), the substrate was dried with a compressed nitrogen flow.

Subsequently, the glass/ITO was further cleaned in an air plasma device (Tucano type—Gambetti), immediately before proceeding to the next step.

The substrate thus treated was ready for the deposition of the cathodic buffer layer. For this purpose, the zinc oxide (ZnO) buffer layer was obtained starting from a 0.162 M solution of the complex [$Zn^{2+}$]-ethanolamine (Aldrich) in butanol (Aldrich). The solution was deposited by rotation on the substrate operating at a rotation speed equal to 600 rpm (acceleration equal to 300 rpm/s), for 2 minutes and 30 seconds, and subsequently at a rotation speed equal to 1500 rpm, for 5 seconds. Immediately after deposition of the cathodic buffer layer, zinc oxide formation was obtained by thermally treating the device at 140° C. for 5 minutes on a hot plate in ambient air. The cathodic buffer layer thus obtained had a thickness equal to 30 nm and was partially removed from the surface with 0.1 M acetic acid (Aldrich), leaving the layer only on the desired surface.

The active layer, comprising regioregular poly-3-hexyl-thiophene (P3HT) (Plexcore OS) and methyl ester of the [6,6]-phenyl-$C_{61}$-butyric acid (PC61BM) (Aldrich), was deposited on the cathodic buffer layer thus obtained by spin coating of a 1:0.8 (v/v) solution in o-dichlorobenzene (Aldrich) with a P3HT concentration equal to 10 mg/ml which had been kept under stirring overnight, operating at a rotation speed of 300 rpm (acceleration equal to 255 rpm/s), for 90 seconds. The thickness of the active layer was found to be 250 nm.

On the active layer thus obtained, the anodic buffer layer was deposited, which was obtained by depositing molybdenum oxide ($MoO_3$) (Aldrich) through a thermal process: the thickness of the anodic buffer layer was equal to 10 nm. A silver (Ag) anode, having a thickness equal to 100 nm, was deposited on the anodic buffer layer by vacuum evaporation, appropriately masking the area of the device in order to obtain an active area equal to 25 mm$^2$.

The depositions of the anodic buffer layer and of the anode were carried out in a standard evaporation chamber under vacuum containing the substrate and two evaporation vessels equipped with a heating resistance containing 10 mg of molybdenum oxide ($MoO_3$) in powder and 10 (Ag) silver shots (diameter 1 mm-3 mm) (Aldrich), respectively. The evaporation process was carried out under vacuum, at a pressure of about $1\times10^{-6}$ bar. The molybdenum oxide ($MoO_3$) and silver (Ag), after evaporation, are condensed in the unmasked parts of the device.

The thicknesses were measured with a Dektak 150 (Veeco Instruments Inc.) profilometer.

The electrical characterization of the device obtained was carried out in a controlled atmosphere (nitrogen) in a glove box, at room temperature (25° C.). The current-voltage curves (I-V) were acquired with a Keithley®2600A multimeter connected to a personal computer for data collection. The photocurrent was measured by exposing the device to the light of an ABET SUN® 2000-4 solar simulator, capable of providing 1.5G AM radiation with an intensity equal to 100 mW/cm$^2$ (1 sun), measured with a Ophir Nova® II powermeter connected to a 3A-P thermal sensor. The device, in particular, is masked before said electrical characterization, so as to obtain an effective active area equal to 16 mm$^2$: Table 1 shows the four characteristic parameters as average values.

Example 6 (Comparative)

Solar Cell Comprising Conjugated Polymer Comprising an Anthradithiophene Derivative Having Formula (Ia)

A polymer-based device was prepared on an ITO (indium-tin oxide) coated glass substrate (Kintec Company—Hong Kong), previously subjected to a cleaning procedure operating as described in Example 5.

The deposition of the cathodic buffer layer and the deposition of the anodic buffer layer were carried out as described in Example 5; the composition of said cathodic buffer layer and the composition of said anodic buffer layer are the same as the ones in Example 5; the thickness of said cathodic buffer layer and the thickness of said anodic buffer layer are the same as the ones in Example 5.

The active layer, comprising the conjugated polymer comprising an anthradithiophene derivative having formula (Ia) obtained as described in Example 4 and methyl ester of the [6,6]-phenyl-$C_{61}$-butyric acid (PC61BM) (Aldrich), was deposited on the cathodic buffer layer thus obtained by spin coating of a 1:1.5 (v/v) solution in o-dichlorobenzene (Aldrich) with a concentration of conjugated polymer comprising an anthradithiophene derivative having formula (Ia) equal to 7 mg/ml which had been kept under stirring overnight, at a temperature of 100° C., operating at a rotation speed equal to 1000 rpm (acceleration equal to 2500 rpm/s), for 30 seconds. The thickness of the active layer was found to be 178 nm.

The deposition of the silver (Ag) anode was carried out as described in Example 5: the thickness of said silver anode (Ag) is the same as the one reported in Example 5.

The thicknesses were measured with a Dektak 150 (Veeco Instruments Inc.) profilometer.

The electrical characterization of the obtained device was carried out as described in Example 5: Table 1 shows the four characteristic parameters as average values.

FIG. 1 shows the current-voltage curve (I-V) obtained [the abscissa shows the voltage in millivolts (V); the ordinate shows the short circuit current density (Jsc) in milli-amps/cm$^2$ (mA/cm$^2$)].

Example 7 (Disclosure)

Solar Cell Comprising [Conjugated Polymer Having Formula (Ia)]

A polymer-based device was prepared on an ITO (indium-tin oxide) coated glass substrate (Kintec Company—Hong Kong), previously subjected to a cleaning procedure operating as described in Example 5.

The deposition of the cathodic buffer layer and the deposition of the anodic buffer layer were carried out as described in Example 5; the composition of said cathodic buffer layer and the composition of said anodic buffer layer are the same as the ones in Example 5; the thickness of said cathodic buffer layer and the thickness of said anodic buffer layer are the same as the ones in Example 5.

The active layer, comprising the conjugated polymer comprising an anthradithiophene derivative having formula (Ia) obtained as described in Example 4 and 3,9-bis(2-methylene-((3-(1,1-dicyanomethylene)-6,7-difluoro)-indanone))-5,5,11,11-tetrakis(4-hexyl-phenyl)-dithieno[2,3-d: 2',3'-d']-s-indacene[1,2-b: 5,6-b']dithiophene (IT-4F) (Ossila), was deposited on the cathodic buffer layer thus obtained by spin coating of a 1:1 (v:v) solution in o-dichlorobenzene (Aldrich) with a concentration of conjugated polymer comprising an anthradithiophene derivative having formula (Ia) equal to 7 mg/ml which had been left under stirring overnight, operating at a rotation speed equal to 2000 rpm (acceleration equal to 2500 rpm/s), for 30 seconds. The thickness of the active layer was found to be 102 nm.

The deposition of the silver (Ag) anode was carried out as described in Example 5: the thickness of said silver anode (Ag) is the same as the one reported in Example 5.

The thicknesses were measured with a Dektak 150 (Veeco Instruments Inc.) profilometer.

The electrical characterization of the obtained device was carried out as described in Example 5: Table 1 shows the four characteristic parameters as average values.

Figure 2:
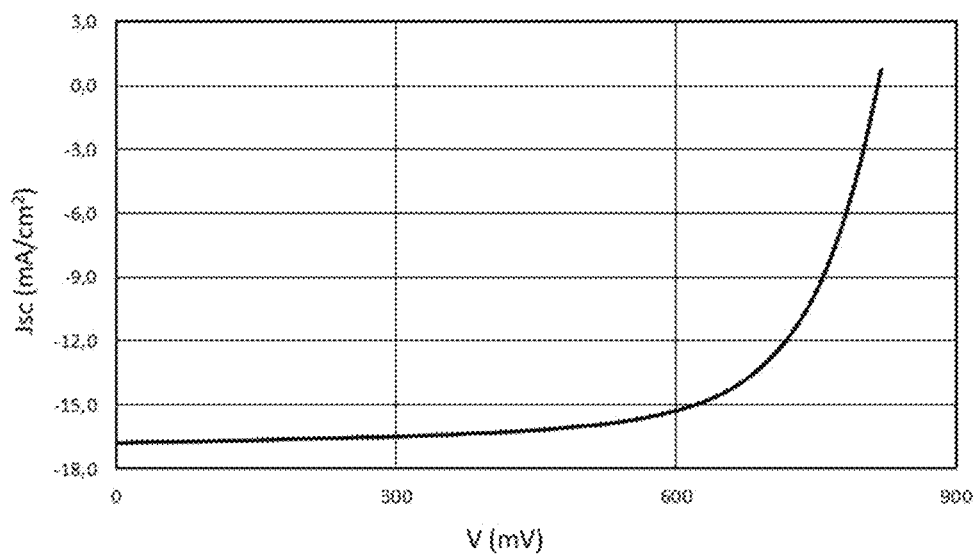
FIG. 2 shows a current-voltage curve (I-V) obtained in Example 7.

FIG. 2 shows the current-voltage curve (I-V) obtained [the abscissa shows the voltage in millivolts (V); the ordinate shows the short circuit current density (Jsc) in milli-amps/cm$^2$ (mA/cm$^2$)].

Figure 3:
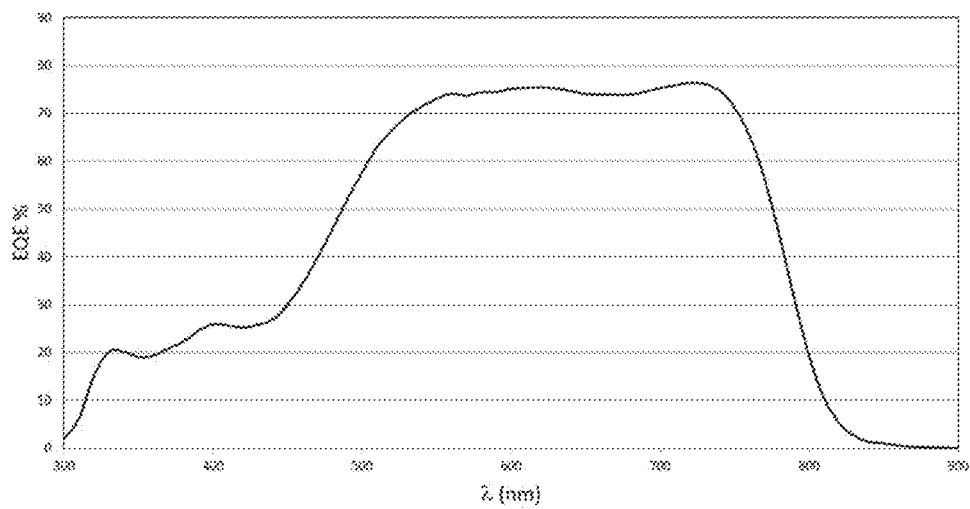
FIG. 3 shows a curve relating to the External Quantum Efficiency (EQE) which was recorded under a monochromatic light in Example 7.

FIG. 3 shows the curve relating to the External Quantum Efficiency (EQE) which was recorded under a monochromatic light (obtained using the TMc300E-U (I/C)—Triple grating monochromator and a double source with a Xenon lamp and a halogen lamp with quartz) in an instrument from Bentham Instruments Ltd [the abscissa shows the wavelength in nanometers (nm); the ordinate shows the External Quantum Efficiency (EQE) in percent (%)].

TABLE 1

| EXAMPLE | FF[1] | $V_{OC}$[2] (V) | $J_{SC}$[3] (mA/cm$^2$) | $PCE_{av}$[4] (%) |
|---|---|---|---|---|
| 5 (comparative) | 0.57 | 0.56 | 10.10 | 3.30 |
| 6 (comparative) | 0.68 | 0.86 | 11.47 | 6.68 |
| 7 (disclosure) | 0.69 | 0.82 | 16.79 | 9.39 |

[1]FF (Fill Factor) is calculated according to the following equation:

$$\frac{V_{MPP} \cdot J_{MPP}}{V_{OC} \cdot J_{SC}}$$

wherein $V_{MPP}$ and $J_{MPP}$ are voltage and current density corresponding to the point of maximum power, respectively, $V_{OC}$ is the open circuit voltage and $J_{SC}$ is the short circuit current density;
[2]$V_{OC}$ is the open circuit voltage;
[3]$J_{SC}$ is the short circuit current density;
[4]$PCE_{av}$ is the device efficiency calculated according to the following equation:

$$\frac{V_{OC} \cdot J_{SC} \cdot FF}{P_{in}}$$

wherein $V_{OC}$, $J_{SC}$ and FF have the same meanings reported above and $P_{in}$ is the intensity of the incident light on the device.

The invention claimed is:

1. Polymeric photovoltaic cell with inverted structure comprising:
   an anode;
   an anodic buffer layer;
   an active layer comprising at least one photoactive organic polymer as electron-donor and at least one electron-acceptor organic compound;
   a cathodic buffer layer; and
   a cathode;
wherein:
   the at least one photoactive organic polymer is selected from conjugated polymers comprising an anthradithiophene derivative having a general formula (I):

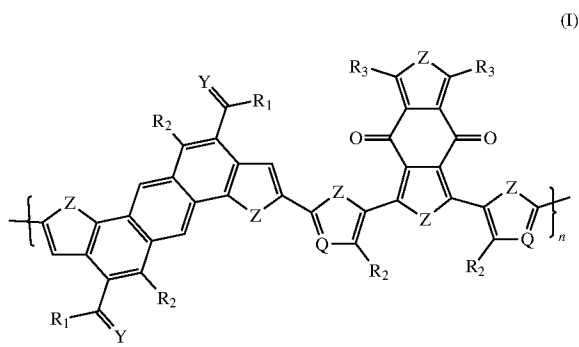

in which:
   Z, equal to or different from each other, represent a sulphur atom, an oxygen atom, or a selenium atom;
   Y, equal to or different from each other, represent a sulphur atom, or an oxygen atom;
   R1, equal to or different from each other, are selected from amino groups —N—R$_4$R$_5$ wherein R$_4$ represents a hydrogen atom, or is selected from alkyl groups C$_1$-C$_{20}$, linear or branched, or is selected from optionally substituted cycloalkyl groups; and R$_5$ is selected from alkyl groups C$_1$-C$_{20}$, linear or branched, or is selected from optionally substituted cycloalkyl groups, or are selected from R$_6$—O—[CH$_2$—CH$_2$—O]$_n$-polyethylenoxyl groups in which R$_6$ represents a hydrogen atom or is selected from alkyl groups C$_1$-C$_{20}$, linear or branched, and n is an integer between 1 and 4, or are selected from —O—R$_7$ groups in which R$_7$ represents a hydrogen atom or is selected from alkyl groups C$_1$-C$_{30}$, linear or branched;
   R$_2$, equal to or different from each other, represent a hydrogen atom or are selected from C$_1$-C$_{20}$, alkyl groups, linear or branched or are selected from —COR$_{10}$ groups in which R$_{10}$ is selected from C$_1$-C$_{20}$ alkyl groups, linear or branched, or are selected from —COOR$_{11}$ groups in which R$_{11}$ is selected from C$_1$-C$_{20}$ alkyl groups, linear or branched, or are selected from optionally substituted aryl groups, or are selected from optionally substituted heteroaryl groups;
   R$_3$, equal to or different from each other, represent a hydrogen atom or are selected from C$_1$-C$_{20}$, alkyl groups, linear or branched, or are selected from —COR$_{10}$ groups in which R$_{10}$ is selected from C$_1$-C$_{20}$ alkyl groups, linear or branched, or are selected from —COOR$_{11}$ groups in which R$_{11}$ is selected from C$_1$-C$_{20}$ alkyl groups, linear or branched, or are selected from optionally substituted aryl groups or are selected from optionally substituted heteroaryl groups;

Q, equal to or different from each other, represents a nitrogen atom or represents a C—R$_3$ group in which R$_3$ has the same meanings as above; and n is an integer between 10 and 500;

wherein:

the at least one organic electron-acceptor compound is selected from a non-fullerene; indacenotiophenes with electron-poor terminal groups; compounds having an aromatic core capable of symmetrically rotating, and wherein the organic electron-acceptor compound is selected from the group consisting of 3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indacene[1,2-b: 5,6-b']-dithiophene, poly{[N,N'-bis(2-octyldodecyl)-1,4,5,8-naphthalene-diimide-2,6-diyl]-alt-5,5'-(2,2'-bithiophene)}, and mixtures thereof.

2. The polymeric photovoltaic cell with inverted structure according to claim 1, wherein in the general formula (I):

Z, equal to each other, represent a sulphur atom;

Y, equal to each other, represent an oxygen atom;

R$_1$, equal to each other, represent a —O—R$_7$ group in which R$_7$ represents a C$_1$-C$_{30}$ alkyl group;

R$_2$, equal to each other, represent a hydrogen atom;

R$_3$, equal to each other, represent a C$_1$-C$_{20}$, alkyl group; and

Q, equal to each other, represent a CR$_3$ group in which R$_3$ represents a hydrogen atom.

3. The polymeric photovoltaic cell with inverted structure according to claim 1, wherein the anode is made of metal or takes the form of grids in a conductive material or is an ink based on metal nanowires.

4. The polymeric photovoltaic cell with inverted structure according to claim 1, wherein the anodic buffer layer is selected from the group consisting of PEDOT:PSS [poly(3,4-ethylenedioxythiophene): polystyrene sulfonate] and polyaniline (PANI).

5. The polymeric photovoltaic cell with inverted structure according to claim 1, wherein the cathodic buffer layer comprises zinc oxide or titanium oxide.

6. The polymeric photovoltaic cell with inverted structure according to claim 1, wherein the cathode is of a material selected from the group consisting of indium tin oxide (ITO), fluorine-doped tin oxide (FTO), aluminum-doped zinc oxide (AZO), and gadolinium oxide-doped zinc oxide (GZO) or takes the form of grids in a conductive material, or it takes the form of an ink based on metal nanowires.

7. The polymeric photovoltaic cell with inverted structure according to claim 1, wherein the cathode is associated with a support layer which is made of transparent rigid material, or of flexible material.

8. Photovoltaic module (or solar module), either on a rigid support or on a flexible support, comprising at least one polymeric photovoltaic cell with inverted structure according to claim 1.

9. The polymeric photovoltaic cell with inverted structure according to claim 1, wherein Z are equal to each other; Y are equal to each other; wherein R$_1$ are equal to each other; wherein the alkyl groups C$_1$-C$_{20}$ of R$_4$ are selected from alkyl groups C$_2$-C$_{10}$; wherein the alkyl groups C$_1$-C$_{20}$ of R$_5$ are selected from alkyl groups C$_2$-C$_{10}$; wherein the alkyl groups C$_1$-C$_{20}$ of R$_6$ are selected from alkyl groups C$_2$-C$_{10}$; wherein the alkyl groups C$_1$-C$_{30}$ of R$_7$ are selected from alkyl groups C$_2$-C$_{24}$; wherein R$_2$ is equal to each other, wherein the alkyl groups C$_1$-C$_{20}$ of R$_2$ are selected from alkyl groups C$_2$-C$_{10}$; wherein the C$_1$-C$_{20}$ alkyl groups of R$_{10}$ are selected from C$_2$-C$_{10}$ alkyl groups; wherein the C$_1$-C$_{20}$ alkyl groups of R$_{11}$ are selected from C$_2$-C$_{10}$ alkyl groups; wherein R$_3$ is equal to each other, wherein the C$_1$-C$_{20}$ alkyl groups of R$_3$ are selected from C$_2$-C$_{10}$ alkyl groups; wherein Q is equal to each other; and wherein n is an integer between 20 and 300; the non-fullerene is selected from the group consisting of compounds based on perylene-diimides or naphthalene-diimides and fused aromatic rings, indacenothiophenes with electron-poor terminal groups, and derivatives of corannulene or truxenone.

10. The polymeric photovoltaic cell with inverted structure according to claim 2, wherein the C$_1$-C$_{30}$ alkyl group of R$_7$ is a 2-octyldodecyloxy group; and wherein the C$_1$-C$_{20}$ alkyl group of R$_3$ is a 2-ethylhexyl group.

11. The polymeric photovoltaic cell with inverted structure according to claim 4, wherein the anode is made of metal, the metal is selected from the group consisting of silver (Ag), gold (Au), and aluminum (Al); wherein the conductive material is selected from the group consisting of silver (Ag), copper (Cu), graphite, graphene, and a transparent conductive polymer; and wherein the metal nanowires include a metal selected from the group consisting of silver (Ag) and copper (Cu).

12. The polymeric photovoltaic cell with inverted structure according to claim 11, wherein the transparent conductive polymer is selected from the group consisting of PEDOT: PSS[poly(3,4-ethylenedioxythiophene): poly(styrene sulfonate)] and polyaniline (PANI).

13. The polymeric photovoltaic cell with inverted structure according to claim 4, wherein the anodic buffer layer is PEDOT: PSS [poly(3,4-ethylenedioxythiophene): polystyrene sulfonate].

14. The polymeric photovoltaic cell with inverted structure according to claim 5, wherein the cathodic buffer layer has zinc oxide.

15. The polymeric photovoltaic cell with inverted structure according to claim 6, wherein the conductive material being is selected from the group consisting of silver (Ag), copper (Cu), graphite, graphene, and a transparent conductive polymer; and wherein the metal nanowires include a metal selected from the group consisting of silver (Ag) and copper (Cu).

16. The polymeric photovoltaic cell with inverted structure according to claim 15, wherein the transparent conductive polymer is selected from the group consisting of PEDOT: PSS [poly (3,4-ethylenedioxythiophene):poly(styrene sulfonate)] and polyaniline (PANI).

17. The polymeric photovoltaic cell with inverted structure according to claim 7, wherein the transparent rigid material is glass or a flexible material.

18. The polymeric photovoltaic cell with inverted structure according to claim 17, wherein the flexible material is selected from the group consisting of polyethylene terephthalate (PET), polyethylene naphthalate (PEN), polyethylene imine (PI), polycarbonate (PC), polypropylene (PP), polyimide (PI), triacetyl cellulose (TAC), and copolymers thereof.

* * * * *